US007442950B2

(12) United States Patent
Osame et al.

(10) Patent No.: US 7,442,950 B2
(45) Date of Patent: Oct. 28, 2008

(54) LIGHT EMITTING DEVICE

(75) Inventors: Mitsuaki Osame, Atsugi (JP); Aya Anzai, Tsukui (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 60 days.

(21) Appl. No.: 11/292,058

(22) Filed: Dec. 2, 2005

(65) Prior Publication Data

US 2006/0118699 A1 Jun. 8, 2006

(30) Foreign Application Priority Data

Dec. 6, 2004 (JP) ............................ 2004-353356

(51) Int. Cl.
*H01L 31/14* (2006.01)
*H01L 29/18* (2006.01)
*G09G 3/32* (2006.01)

(52) U.S. Cl. ........................... 250/552; 345/82; 257/88

(58) Field of Classification Search .............. 250/214.1, 250/214 R, 208.1, 216, 214 A, 214 LA, 214 LS, 250/552; 345/204, 211, 212, 39, 55, 76, 345/80, 36, 46, 82–84; 315/169.1, 169.3; 257/88, 89
See application file for complete search history.

(56) References Cited

U.S. PATENT DOCUMENTS

| | | | | |
|---|---|---|---|---|
| 5,594,463 | A | 1/1997 | Sakamoto | |
| 6,486,607 | B1 * | 11/2002 | Yeuan | 315/169.1 |
| 6,528,951 | B2 | 3/2003 | Yamazaki et al. | |
| 6,720,198 | B2 | 4/2004 | Yamagata | |
| 6,828,950 | B2 * | 12/2004 | Koyama | 345/76 |
| 6,853,370 | B2 | 2/2005 | Numao | |
| 6,873,116 | B2 | 3/2005 | Kimura et al. | |
| 7,180,485 | B2 | 2/2007 | Kimura et al. | |
| 7,221,338 | B2 | 5/2007 | Yamazaki et al. | |
| 7,245,297 | B2 | 7/2007 | Kimura et al. | |
| 2001/0030511 | A1 | 10/2001 | Yamazaki et al. | |
| 2001/0033252 | A1 | 10/2001 | Yamazaki et al. | |

(Continued)

FOREIGN PATENT DOCUMENTS

CN 1318818 10/2001

(Continued)

OTHER PUBLICATIONS

Office Action (Chinese Patent Application No. 200510129551.9; CN8393) dated Feb. 15, 2008.

*Primary Examiner*—Georgia Y. Epps
*Assistant Examiner*—Don Williams
(74) *Attorney, Agent, or Firm*—Fish & Richardson, P.C.

(57) ABSTRACT

The invention has a monitoring portion which detects change of ambient temperature and degradation with time, provided with a plurality of monitoring pixels and a monitoring line. Each of the plurality of monitoring pixels has a light emitting element for monitoring, a constant current source, a switch, and a detecting circuit, and one electrode of the light emitting element for monitoring is connected to the monitoring line through the switch. The detecting circuit controls on and off of the switch, and specifically in the case where both electrodes of the light emitting element for monitoring are short-circuited, the switch is turned off. The invention having the aforementioned configuration generates no potential change of the power supply line of the pixel portion when both electrodes of a light emitting element for monitoring are short-circuited.

36 Claims, 8 Drawing Sheets

U.S. PATENT DOCUMENTS

| | | | |
|---|---|---|---|
| 2002/0089496 | A1 | 7/2002 | Numao |
| 2002/0101395 | A1 | 8/2002 | Inukai |
| 2003/0209989 | A1 | 11/2003 | Anzai et al. |
| 2004/0100463 | A1 | 5/2004 | Miyagawa |
| 2004/0178726 | A1 | 9/2004 | Yamagata |
| 2005/0012731 | A1 | 1/2005 | Yamazaki et al. |
| 2005/0017963 | A1 | 1/2005 | Yamazaki et al. |
| 2005/0017964 | A1 | 1/2005 | Yamazaki et al. |
| 2005/0225250 | A1 | 10/2005 | Anzai et al. |
| 2006/0007218 | A1* | 1/2006 | Miyake et al. .............. 345/204 |
| 2006/0022206 | A1 | 2/2006 | Hayakawa |
| 2006/0033452 | A1 | 2/2006 | Yamazaki et al. |
| 2006/0038501 | A1 | 2/2006 | Koyama |
| 2006/0038804 | A1 | 2/2006 | Hayakawa |
| 2006/0109216 | A1 | 5/2006 | Iwabuchi et al. |
| 2006/0139254 | A1 | 6/2006 | Hayakawa |

FOREIGN PATENT DOCUMENTS

| | | | |
|---|---|---|---|
| CN | 1453757 | | 11/2003 |
| EP | 1 148 466 | A2 | 10/2001 |
| JP | 02-287492 | | 11/1990 |
| JP | 4128875 | | 4/1992 |
| JP | 2000-227776 | | 8/2000 |
| JP | 2002278498 | | 9/2002 |
| JP | 2002318546 | | 10/2002 |
| JP | 2002-333861 | | 11/2002 |
| JP | 2003-323159 | | 11/2003 |
| JP | 2003317944 | | 11/2003 |
| JP | 2004170943 | | 6/2004 |
| WO | WO-2004/040541 | | 5/2004 |
| WO | WO-2006/011666 | | 2/2006 |
| WO | WO-2006/016706 | | 2/2006 |

* cited by examiner

LIGHT EMITTING DEVICE

BACKGROUND OF THE INVENTION

1. Field of the Invention

The present invention relates to a light emitting device and an electronic apparatus having a self light-emitting element.

2. Description of the Related Art

In recent years, a light emitting device including a light emitting element typified by an EL (Electro Luminescence) element has been developed. Wide use thereof is expected by making use of advantages such as high image quality, a wide viewing angle, a thin type, and a light weight because of a self light-emitting type. In general, a light emitting element is an element of a current drive type, and a current value flowing through a light emitting element and luminance of the light emitting element are almost proportionate to each other. Therefore, there is a display apparatus which adopts constant current drive that flows a constant current to a light emitting element (for example, see Patent Document 1).

Further, a light emitting element has a temperature dependence; when a surrounding temperature (hereinafter also referred to as an ambient temperature) is high, the resistance value decreases while in a low temperature, the resistance value increases. Moreover, a light emitting element has a characteristic of degrading along with time so that the resistance value increases by degradation with time (hereinafter also referred to as time degradation). Therefore, there is a light emitting device which controls an effect by a change of ambient temperature and time degradation of a light emitting element (for example, see Patent Document 2).

A light emitting device described in Patent Document 2 has a light emitting element, a power supply line, a buffer amplifier, a light emitting element for monitoring, and a constant current source. Constant current is supplied from the constant current source to the light emitting element for monitoring. When a change of ambient temperature and time degradation occur, the current value of the light emitting element for monitoring is not changed, while a potential of one electrode of the light emitting element for monitoring is changed. One electrode of the light emitting element for monitoring is connected to the power supply line through the buffer amplifier so that a potential of the power supply line is also changed when a potential of one electrode of the light emitting element for monitoring is changed in accordance with a change of ambient temperature and time degradation. Further, by changing a potential of a power supply line in accordance with a change of ambient temperature and time degradation, a light emitting device described in Patent Document 1 can control an effect by a change of resistance value of a light emitting element due to a change of ambient temperature and time degradation.

[Patent Document 1] Japanese Patent Laid-Open No. 2003-323159

[Patent Document 2] Japanese Patent Laid-Open No. 2002-333861

SUMMARY OF THE INVENTION

An electronic apparatus which mounts a display function such as an information terminal and a mobile phone has been widespread. However, many electronic apparatuses of the aforementioned electronic apparatus use a battery so that a suppliable power source is limited and decrease of power consumption is a problem. However, when constant current drive is adopted similarly to the light emitting device described in Patent Document 1, a driving transistor connected to a light emitting element in serial is required to be operated in a saturation region. Therefore, a high driving voltage is required to increase power consumption. In view of the aforementioned problems, the invention provides a light emitting device which may reduce power consumption.

Moreover, a light emitting element includes an anode, a cathode, and a layer (hereinafter also called an organic light emitting layer) including a light emitting material between the anode and the cathode. Since the organic light emitting layer has a thin film thickness, the anode and the cathode may be short-circuited (hereinafter also called short-circuit between both electrodes) in an initial stage of manufacturing the light emitting element or in use thereof due to dust in a manufacturing process and other defects. In Patent Document 2, when both electrodes of the light emitting element for monitoring are short-circuited, current supplied from the constant current source focuses on a short-circuited portion of the light emitting element for monitoring. Then, a potential of one electrode of the light emitting element for monitoring decreases, a potential of an input portion of a buffer amplifier connected to one electrode of the light emitting element for monitoring decreases, and potentials of a power supply line which supplies current to a light emitting element of a pixel portion also decreases. That is, when both electrodes of the light emitting element for monitoring are short-circuited, the effect causes a potential change of the power supply line. When a potential change of the power supply line occurs, a desirable voltage value is not applied between both the electrodes of the light emitting element. Then, the light emitting element does not emit light at desirable luminance to decrease accuracy of a grayscale display.

In view of the aforementioned problems, the invention provides a light emitting device which has a plurality (n, n is a natural number) of light emitting elements for monitoring, and which causes no potential change of a power supply line of a pixel portion when both respective electrodes of (n−1) or less light emitting elements for monitoring are short-circuited. In addition, the invention provides a light emitting device which can display an image accurately even when both electrodes of the light emitting element for monitoring are short-circuited.

A light emitting device of the invention has a monitoring portion which detects a change of ambient temperature and degradation with time. The monitoring portion has a plurality of monitoring pixels and a monitoring line. Each of the plurality of monitoring pixels has a light emitting element for monitoring, a constant current source, a switch, and a detecting circuit. One electrode of the light emitting element for monitoring is connected to the monitoring line through the switch. The constant current source supplies a constant current to the light emitting element for monitoring. The detecting circuit is a circuit which controls on and off of the switch, and specifically, the switch is turned off (non-conductive) in the case where both electrodes of the light emitting element for monitoring are short-circuited.

A light emitting device of the invention having the aforementioned configuration is described with reference to FIG. 1. A monitoring portion 107 has a plurality of monitoring pixels 100 and a monitoring line 105. The monitoring pixel 100 has a light emitting element for monitoring 104, a constant current source 101, a switch 102, and a detecting circuit 103.

One of the anode and cathode of the light emitting element for monitoring 104 is connected to the monitoring line 105 through the switch 102. The other one of the anode and cathode of the light emitting element for monitoring 104 is connected to a common power source 115.

The constant current source 101 supplies a constant current to the light emitting element for monitoring 104.

An input terminal of the detecting circuit 103 is connected to one electrode of the light emitting element for monitoring 104, and an output terminal of the detecting circuit 103 is connected to the switch 102. The detecting circuit 103 is a circuit which controls on and off of the switch 102, and more specifically, in accordance with one potential of the anode and cathode of the light emitting element for monitoring 104, on and off of the switch 102 are controlled. In the case where both the electrodes of the light emitting element for monitoring 104 are short-circuited, a potential to turn off the switch 102 is outputted to the switch 102. In the case where both the electrodes of the light emitting element for monitoring 104 are not short-circuited, a potential to turn on the switch 102 is outputted to the switch 102.

When both the electrodes of the light emitting element for monitoring 104 are short-circuited, the invention having the aforementioned configuration detects it, and controls the switch 102 not to connect between the monitoring line 105 and the light emitting element for monitoring 104 in which both electrodes are short-circuited. Therefore, when both electrodes of the light emitting element for monitoring 104 are short-circuited, the effect can be controlled.

In addition to the aforementioned configuration, the light emitting device of the invention has a buffer amplifier 106. An input portion of the buffer amplifier 106 is connected to the monitoring line 105.

In addition to the aforementioned configuration, the light emitting device of the invention has a pixel portion including a plurality of pixels and a power supply line. Each of the plurality of pixels has a light emitting element and a driving transistor. One electrode of the light emitting element is connected to the power supply line through the driving transistor. The power supply line is connected to an output portion of the buffer amplifier 106. The monitoring line 105 that the monitoring portion 107 includes and the power supply line that the pixel portion includes are connected through the buffer amplifier 106.

As set forth above, in the invention having the monitoring portion 107 and the pixel portion, when both electrodes of the light emitting element for monitoring 104 are short-circuited, a potential of the monitoring line 105 is not changed due to the short-circuit between both the electrodes, thereby a potential of the power supply line of the pixel portion is also not changed. Therefore, an image can be displayed accurately in the pixel portion.

Further, the driving transistor that each of the plurality of pixels includes operates in a linear region. Moreover, the invention adopts a constant voltage drive that applies a constant voltage to the light emitting element. The constant voltage drive is not required to operate the driving transistor in a saturation region and not required to increase a driving voltage. Therefore, compared to the constant current drive, power consumption can be reduced.

In addition, the light emitting element for monitoring 104 and a light emitting element provided in the pixel portion are formed over the same insulating surface (over the same substrate). That is, the light emitting element for monitoring 104 and the light emitting element provided in the pixel portion are manufactured by the same process. Therefore, a characteristic in relation to a change of ambient temperature and time degradation is the same or almost the same.

Further, the invention provides a panel using the light emitting device of the aforementioned configuration. The panel is in a state that a plurality of pixels are sealed, and in many cases is equivalent to a state that the plurality of pixels are sealed by a pair of substrates.

The invention provides a module using the light emitting device of the aforementioned configuration. The module is in a state that a printed circuit board is connected to the aforementioned panel, and a plurality of IC chips corresponding to a controller circuit or a power supply circuit are mounted on the printed circuit board.

The invention provides a portable terminal using the light emitting device of the aforementioned configuration. The portable terminal corresponds to a mobile phone set (also called a mobile phone device or a mobile phone), a PDA (Personal Digital Assistant), an electronic organizer, a portable game machine, and the like.

The invention provides a digital camera using the light emitting device of the aforementioned configuration. The configuration of the light emitting device of the invention is used as a display portion of the digital camera.

The invention provides a digital video camera using the light emitting device of the aforementioned configuration. The configuration of the light emitting device of the invention is used as a display portion of the digital video camera.

The invention provides a display using the light emitting device of the aforementioned configuration. The display corresponds to a monitor used for a personal computer or for displaying advertisement.

The invention provides a television apparatus using the light emitting device of the aforementioned configuration.

The invention having a monitoring portion can suppress an effect by a change of resistance value of a light emitting element due to an ambient temperature and time degradation.

According to the invention having a light emitting element for monitoring, a constant current source, an switch, and a detecting circuit, when both electrodes of the light emitting element for monitoring are short-circuited, a potential of a monitoring line is not changed due to the short-circuit between both the electrodes. Therefore, a potential of a power supply line which supplies power a light emitting element in a pixel portion may be kept normal. As a result, it is possible to provide a light emitting device in which reliability is improved. Moreover, the invention can improve reliability of merchandise using a light emitting device. Therefore, the merchandise may be shipped with ease.

Further, the invention which operates a driving transistor in a linear region uses a constant voltage drive. Compared to the case of using the constant current drive, a driving voltage of a light emitting element can be reduced to decrease power consumption.

DETAILED DESCRIPTION OF THE INVENTION

Figure 1:
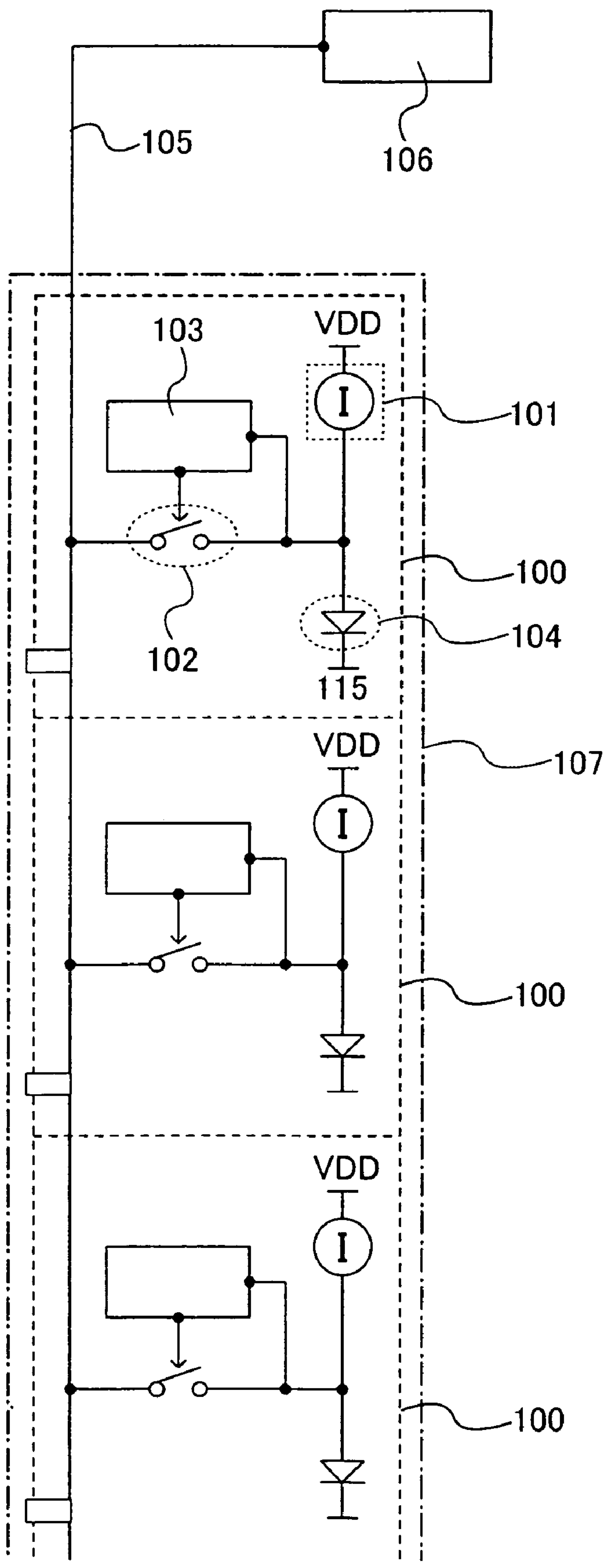
FIG. 1 is a diagram showing a light emitting device of the invention.

Although the present invention will be fully described by way of embodiment modes with reference to the accompanying drawings, it is to be understood that various changes and modifications will be apparent to those skilled in the art. Therefore, unless otherwise such changes and modifications depart from the scope of the invention, they should be construed as being included therein. Note that in all drawings to describe embodiment modes, the same portion or a portion which has a similar function is denoted by the same reference numeral and repetitive description is omitted.

Embodiment Mode1

Figure 2:
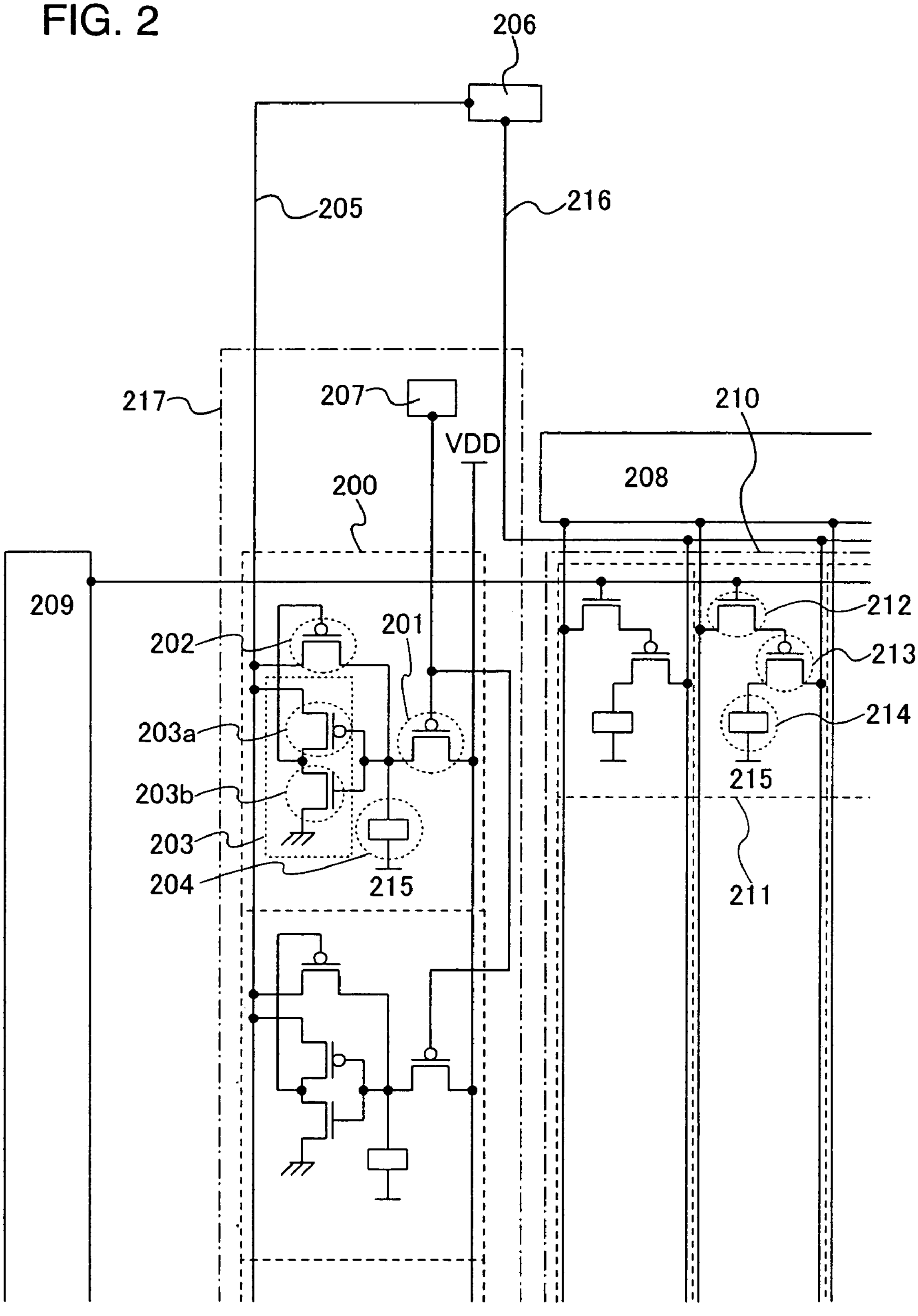
FIG. 2 is a diagram showing a light emitting device of the invention.

A configuration of a light emitting device of the invention is described with reference to the drawing (see FIG. 2). The light emitting device of the invention has a pixel portion 210, a monitoring portion 217, a buffer amplifier 206, a source driver 208, and a gate driver 209.

The pixel portion 210 has a plurality of pixels 211. Each of the plurality of pixels 211 has a light emitting element 214, a writing transistor 212, and a driving transistor 213. Note that in addition to the aforementioned configuration, each of the plurality of pixels 211 may be provided with a capacitor for holding a gate-source voltage of the driving transistor 213.

The light emitting element 214 has an anode, a cathode, and an electroluminescent layer which is interposed between the anode and the cathode. One of the anode and cathode of the light emitting element 214 is connected to a source electrode or a drain electrode of the driving transistor 213, while the other one of the anode and cathode of the light emitting element 214 is connected to a common power source 215. Herein, description is made on a mode where a current flowing through the light emitting element 214 flows from an electrode side of the light emitting element 214 connected to the driving transistor 213 to an electrode side not connected to the driving transistor 213, or a mode where an electrode side of the light emitting element 214 connected to the driving transistor 213 is the anode and an electrode side from which current flows to the common power source 215 is the cathode. Note that in the case where the current direction flowing through the light emitting element 214 is opposite, conductivity of the driving transistor 213 or connection between the driving transistor 213 and the light emitting element 214 is changed appropriately.

The writing transistor 212 loads a video signal from the source driver 208 to each pixel 211 by a signal of the gate driver 209. That is, the writing transistor 212 is a transistor which controls the loading of the video signal to the pixel 211.

The driving transistor 213 is a transistor which controls current supply to the light emitting element 214 in accordance with a potential of the loaded video signal. Note that the driving transistor 213 operates in a linear region. Therefore, a potential applied to the electrode side of the light emitting element 214 connected to the driving transistor 213 is almost equivalent to a potential of a power supply line 216, and the amount of current flowing to the light emitting element 214 is determined by a potential difference between the power supply line 216 and the common power source 215. The invention which operates the driving transistor 213 in a linear region adopts a constant voltage drive which applies a constant voltage to the light emitting element 214. The constant voltage drive is not required to operate the driving transistor 213 in a saturation region and not required to increase a driving voltage. Therefore, compared to the constant current drive, power consumption can be reduced.

The monitoring portion 217 has a plurality of monitoring pixels 200, a monitoring line 205, and a current value control circuit 207. Each of the plurality of monitoring pixels 200 has a light emitting element for monitoring 204, a constant current source 201, a detection inverter 203, and a switch 202.

A plurality of the light emitting elements for monitoring 204 are connected to the monitoring line 205. Therefore, a potential of the monitoring line 205 is an average potential of one potential of an anode and a cathode of the plurality of the light emitting elements for monitoring 204.

The light emitting element for monitoring 204 has an anode, a cathode, and an electroluminescent layer which is interposed between the anode and the cathode. One of the anode and cathode of the light emitting element for monitoring 204 is connected to the monitoring line 205 through the switch 202. The other one of the anode and cathode of the light emitting element for monitoring 204 is connected to the common power source 215. In this embodiment mode, description is made on the case where an electrode side of the light emitting element for monitoring 204 connected to the constant current source 201 is the anode and an electrode side of the light emitting element for monitoring 204 connected to the common power source 215 is the cathode. In this case, current flows from the anode of the light emitting element for monitoring 204 to the cathode thereof.

The constant current source 201 is a P-channel transistor. A source electrode of the P-channel transistor is connected to a high potential power source (VDD) while a gate electrode of the P-channel transistor is connected to the current value control circuit 207. Note that a configuration of the constant current source 201 is not limited to the aforementioned configuration, and a configuration including a current mirror circuit or a transistor-variation correction circuit may be used.

The switch 202 is a P-channel transistor. Note that as long as an element including a switching function is used for the switch 202, the switch 202 is not limited to the P-channel transistor, and an N-channel transistor, an analog switch, or the like may be used.

The detection inverter 203 has a P-channel transistor 203*a* and an N-channel transistor 203*b* which are connected in series. A source electrode of the P-channel transistor 203*a* is connected to the monitoring line 205 while a source electrode of the N-channel transistor 203*b* is connected to a low potential power source (GND). Note that the source electrode of the P-channel transistor 203*a* may be connected to the power supply line 216. Further, the source electrode of the N-channel transistor 203*b* is not required to be connected to a ground power source (GND). As long as an outputted potential of the detection inverter 203 is a potential to open and close of the switch 202, an appropriate power source from a plurality of power sources arranged at the periphery of the monitoring pixel 200 may be used as a power source connected to the source electrode of the N-channel transistor 203*b*. Moreover, as a detecting circuit, it is not limited to a configuration using the detection inverter 203, and other configurations instead of the detection inverter 203 may be used when a short-circuit between both electrodes of the light emitting element for monitoring 204 is detected to turn on (conductive) or off (non-conductive) the switch 202 in the configuration.

The current value control circuit 207 is connected to the constant current source 201. Current value that the constant current source 201 supplies is determined by a potential supplied from the current value control circuit 207 so that the current flows to the light emitting element for monitoring 204.

The buffer amplifier 206 has an input portion and an output portion. The input portion of the buffer amplifier 206 is connected to the monitoring line 205 while the output portion thereof is connected to the power supply line 216. The buffer amplifier 206 is a circuit which has high input impedance, equal potentials of input and output, and the output current capacity (also called as current ability) thereof is high. Further, the buffer amplifier 206 is a circuit which has low output impedance. Therefore, other circuits may be used instead of the buffer amplifier 206 when the circuit has the aforementioned characteristics. For example, an amplifier, such as an operational amplifier, a sense amplifier, a differential amplifier, may be used as the circuit.

In the aforementioned configuration, when there is a state in which both electrodes of the light emitting element for monitoring 204 are not short-circuited, one potential of the anode and cathode of the light emitting element for monitoring 204 is applied to an input portion of the detection inverter 203. Then, an output of the detection inverter 203 is a potential of the GND to turn on (conductive state) the switch 202.

On the other hand, when both the electrodes of the light emitting element for monitoring 204 are short-circuited, a potential of the input portion of the detection inverter 203 is close to 0 V. Then, the output of the detection inverter 203 is a potential to turn off the switch 202 so that the switch 202 is turned off.

The invention having the aforementioned configuration, when both electrodes of the light emitting element for monitoring 204 are short-circuited, turns off the switch 202 provided between the monitoring line 205 and the light emitting element for monitoring 204, and therefore, a potential of the light emitting element for monitoring 204 in which both electrodes thereof are short-circuited is not transmitted to the monitoring line 205. Accordingly, a potential of the monitoring line 205 is not changed due to the short-circuit between both the electrodes of the light emitting element for monitoring 204. That is, even when both electrodes of the light emitting element for monitoring 204 are short-circuited, the potential of the monitoring line 205, that is, the power supply line 216 which supplies power to the light emitting element 214 of the pixel portion 210 may continue to hold a normal potential. The invention having the aforementioned configuration contributes to improve reliability of a light emitting device.

Note that in the aforementioned configuration, although the monitoring pixel 200 is provided between the pixel portion 210 and the gate driver 209, a position to provide the monitoring pixel 200 is not limited particularly. For example, the monitoring pixel 200 may be provided between the source driver 208 and the pixel portion 210.

Further, the current value control circuit 207, the buffer amplifier 206, the source driver 208, and the gate driver 209 may be provided over a substrate which has the same insulating surface, or a part of the circuits may be provided over another substrate.

Moreover, although description is made in the case where the light emitting element 214 is a monochrome element in this embodiment mode, in the case of a plurality of light emitting elements such as for red, green, and blue light, it is required to provide a plurality of the monitoring pixels 200, the buffer amplifiers 206, the power supply lines 216, and the like.

Further, although description is made that current always flows to the light emitting element for monitoring 204 in this embodiment mode, the invention may be controlled so that current flows to the light emitting element for monitoring 204 intermittently. However, it is needless to say that the design is made in such that a potential of the input portion of the buffer amplifier 206 is held in a period in which current does not flow to the light emitting element for monitoring 204.

Moreover, although description is made on a configuration of the invention which is an active-matrix light emitting device in the aforementioned mode, the invention may be applied to a passive-matrix light emitting device. The passive-matrix light emitting device has a pixel portion, a column signal line driver circuit, and a row signal line driver circuit which are provided over a substrate. The pixel portion has each column signal line arranged in a column direction, a row signal line arranged in a row direction, and a plurality of light emitting elements arranged in matrix. A monitoring portion and a buffer amplifier are provided over the same substrate over which the pixel portion is formed to obtain an effect of the invention.

Embodiment Mode 2

Figure 3:
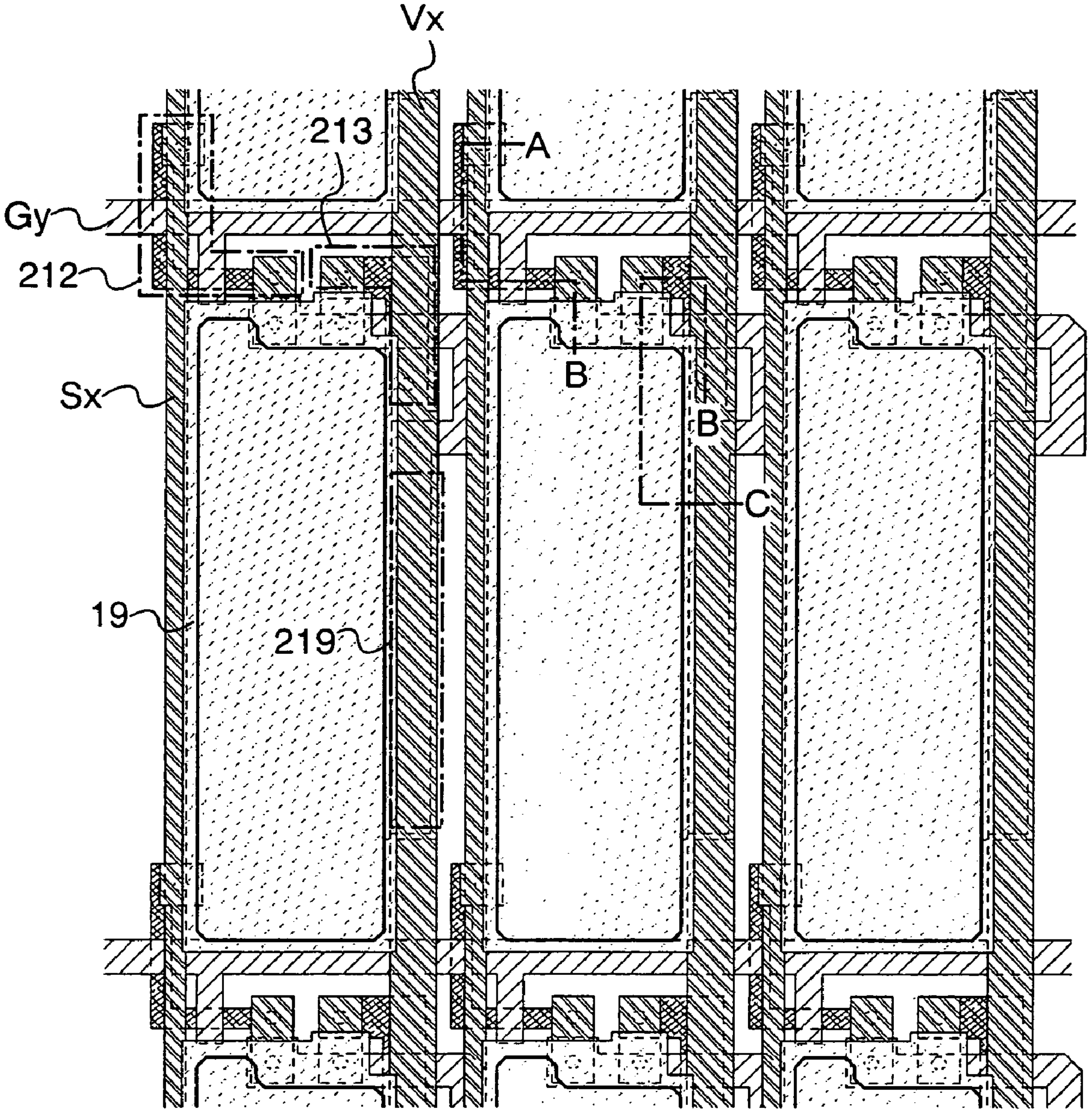
FIG. 3 is a diagram showing an upper surface structure of a light emitting device of the invention.
Figure 4:
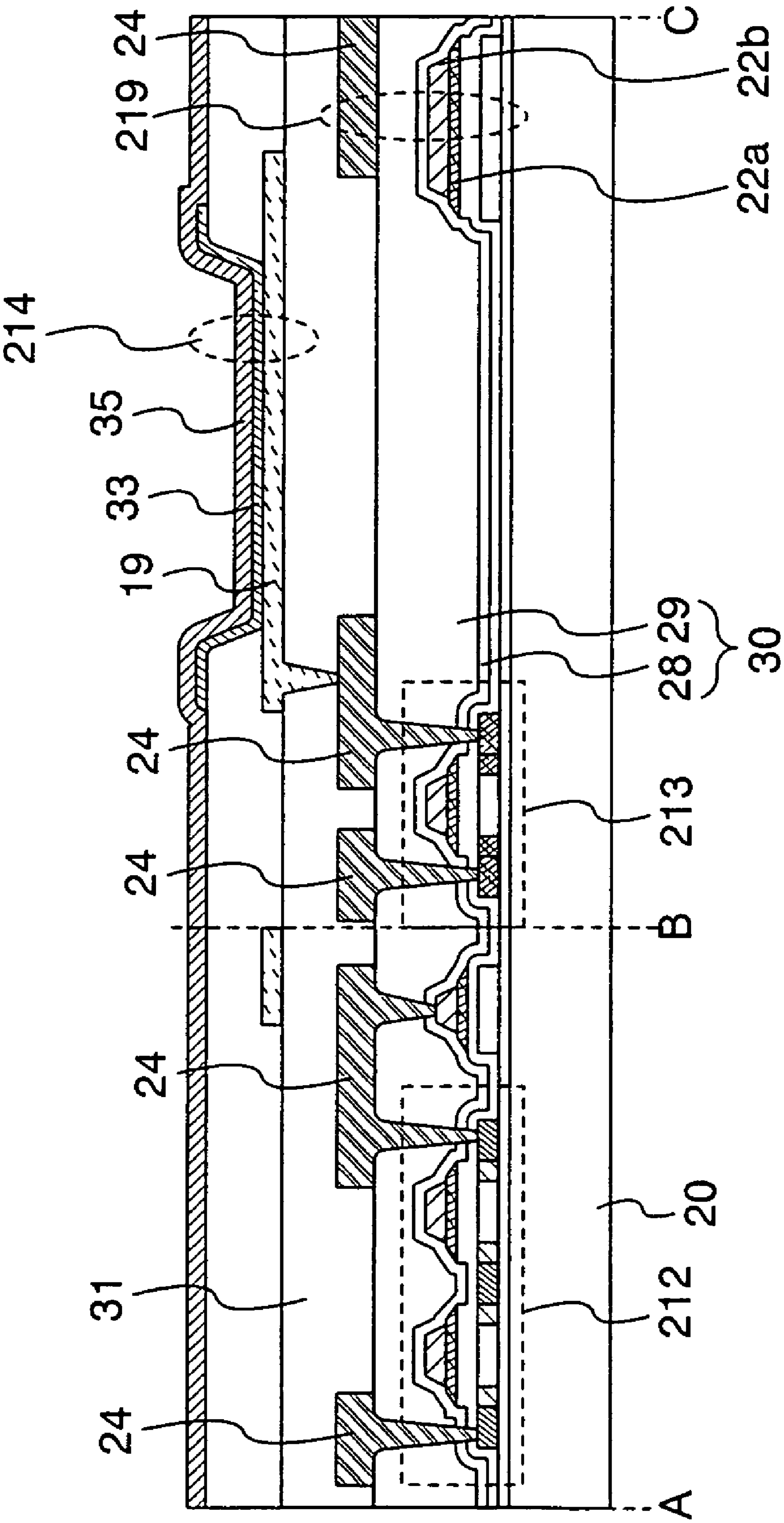
FIG. 4 is a diagram showing a cross sectional structure of a light emitting device of the invention.

A cross sectional structure and an upper surface structure of a light emitting device of the invention are described with reference to the drawings. More specifically, the cross sectional structure and the upper surface structure of the light emitting device including the writing transistor 212, the driving transistor 213, the light emitting element 214, and a capacitor 219 are described with reference to FIGS. 3 and 4.

A glass substrate, a quartz substrate, a stainless steel substrate, and the like may be used as a substrate 20 which has an insulating surface. Further, a substrate composed of synthetic resin which has flexibility such as acrylic and plastic of polyethylene terephthalate (PET), polyethylene naphthalate (PEN), and the like may be used when it can resist processing temperature in a manufacturing process.

First, a base film is formed over the substrate 20. An insulating film of silicon oxide, silicon nitride, silicon nitride oxide, and the like may be used as the base film. Next, an amorphous semiconductor film is formed over the base film. The thickness of the amorphous semiconductor film is 25 to 100 nm. Further, the amorphous semiconductor film may be formed using silicon germanium as well as silicon. Subsequently, the amorphous semiconductor film is crystallized as needed to form a crystalline semiconductor film. A method of crystallization may use a furnace, laser irradiation, light irradiation emitted from a lamp, or combination thereof. For example, a metal element is added to an amorphous semiconductor film and heat treatment using a furnace is performed to form a crystalline semiconductor film. Thus, adding a metal element is preferable to crystallize an amorphous semiconductor film at a low temperature.

Next, the crystalline semiconductor film is selectively etched to form a predetermined shape. Subsequently, an insulating film which functions as a gate insulating film is formed. The insulating film is formed with a thickness of 10 to 150 nm to cover the semiconductor film. For example, a silicon oxynitride film, a silicon oxide film, and the like may be used to be a mono-layer structure or a stacked layer structure.

Next, a conductive film which functions as a gate electrode is formed on the gate insulating film. The gate electrode may be a mono layer or a stacked layer, and herein conductive films **22*a* and 22*b* are stacked to form the gate electrode. The conductive films 22*a* and 22*b* are formed using an element selected from tantalum (Ta), tungsten (W), titanium (Ti), molybdenum (Mo), aluminum (Al), and copper (Cu), or an alloy material or a compound material which mainly contains the aforementioned elements. In this embodiment mode, a tantalum nitride film is formed with a thickness of 10 to 50 nm as the conductive film 22***a* and a tungsten film is formed with a thickness of 200 to 400 nm as the conductive film 22*b*.

Next, with the gate electrode as a mask, an impurity region is formed by adding an impurity element. At this time, in addition to a high concentration impurity region, a low concentration impurity region may be formed. The low concentration impurity region is called an LDD (Lightly Doped Drain) region.

Next, insulating films 28 and 29 which function as an interlayer insulating film 30 are formed. The insulating film 28 is preferable to be an insulating film containing nitrogen, and herein formed by using a silicon nitride film with a thickness of 100 nm by plasma CVD. The insulating film 29 is preferable to be formed by using an organic material or an inorganic material. Polyimide, acrylic, polyamide, polyimide amide, benzocyclobutene, siloxane, or polysilazane may be used as the organic material. Siloxane is composed of a skeleton formed by the bond of silicon (Si) and oxygen (O), in which containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. Moreover, polysilazane is formed by a polymer material which has the bond of silicon (Si) and nitrogen (N), that is, a liquid material containing polysilazane as a starting material. An insulating film containing nitrogen or oxygen such as silicon oxide ($SiO_x$), silicon nitride ($SiN_x$), silicon oxynitride ($SiO_xN_y$) (x>y), and silicon nitride oxide ($SiN_xO_y$) (x>y) (x and y are natural numbers) may be used as the inorganic material. Note that a film including the organic material has good planarity, and on the other hand, moisture and oxygen are absorbed by the organic material. To prevent the absorption, an insulating film which has an inorganic material may be formed over the insulating film including the organic material.

Next, after forming a contact hole in the interlayer insulating film 30, a conductive film 24 is formed which functions as source and drain wirings of the writing transistor 212, source and drain wirings of the driving transistor 213, a signal line Sx, and a power supply line Vx. The conductive film 24 may be formed by using a film composed of an element of aluminum (Al), titanium (Ti), molybdenum (Mo), tungsten (W), or silicon (Si) or an alloy film which uses the aforementioned elements. In this embodiment mode, a stacked film of a titanium film, a titanium nitride film, a titanium-aluminum alloy film, and a titanium film is formed.

Next, an insulating film 31 is formed to cover the conductive film 24. The material shown for the interlayer insulating film 30 may be used for the insulating film 31. Subsequently, a pixel electrode (also called a first electrode) 19 is formed at an opening portion provided at the insulating film 31. In the opening portion, to increase step coverage of the pixel electrode 19, an end of the opening portion may be rounded to have a plurality of radii of curvature. As a material which has a light-transmitting property, indium tin oxide (ITO), IZO (Indium Zinc Oxide) in which zinc oxide of 2 to 20 at % is mixed with indium oxide, a compound in which silicon oxide ($SiO_2$) of 2 to 20 at % is mixed with indium tin oxide, organic indium, organic zinc, and the like may be used to form the pixel electrode 19. Further, an element selected from tantalum, tungsten, titanium, molybdenum, aluminum, and copper as well as silver (Ag), or an alloy material or a compound material which mainly contains the aforementioned elements may be used as a material which has a non-light-transmitting property. At this time, when the insulating film 31 is formed by using an organic material to increase the planarity, the planarity of the surface over which the pixel electrode is formed increases, so that a constant voltage can be applied to the light emitting element 214 and a short-circuit of the light emitting element 214 can be prevented.

Next, an electroluminescent layer 33 is formed by a vapor deposition method or an ink-jet method. The electroluminescent layer 33 has an organic material or an inorganic material, and is formed by arbitrarily combining an electron injection layer (EIL), an electron transporting layer (ETL), a light emitting layer (EML), a hole transporting layer (HTL), a hole injection layer (HIL), and the like. Note that boundaries between the layers are not required to be clearly defined, and there is also the case where materials forming the respective layers are partially mixed with each other, which blurs the boundaries.

Then, an opposite electrode (also called a second electrode) 35 is formed by a sputtering method or a vapor deposition method. One of the pixel electrode 19 and the opposite electrode 35 is an anode while the other thereof is a cathode.

As an anode material, it is preferable to use a metal, an alloy, a conductive compound, or a mixture thereof which has a high work function (a work function of 4.0 eV or more). As a specific example of the anode material, used is gold (Au), platinum (Pt), nickel (Ni), tungsten (W), chromium (Cr), molybdenum (Mo), iron (Fe), cobalt (Co), copper (Cu), and palladium (Pd), or nitride of a metal material (TiN and the like), and the like as well as ITO (Indium Tin Oxide) and IZO (Indium Zinc Oxide) in which zinc oxide (ZnO) of 2 to 20 at % is mixed with indium oxide.

On the other hand, as a cathode material, it is preferable to use a metal, an alloy, an electroconductive compound, or a mixture thereof which has a low work function (a work function of 3.8 eV or less). As a specific example of the cathode material, it may be formed by using an element which belongs to Group 1 or Group 2 of the Periodic Table of the Elements, that is, an alkaline metal such as lithium (Li) and cesium (Cs), an alkaline-earth metal such as magnesium (Mg), calcium (Ca), and strontium (Sr), an alloy (Mg:Ag, Al:Li) or a compound (lithium fluoride (LiF), cesium fluoride (CsF), and calcium fluoride ($CaF_2$)) containing the aforementioned metals, or a transition metal including a rare-earth metal. However, since the cathode is required to have a light-transmitting property, these metals or alloys containing these metals are formed extremely thinly and stacked with a metal (including an alloy) such as ITO (Indium Tin Oxide) to be formed.

Then, a protective film including a silicon nitride film or a DLC (Diamond Like Carbon) film may be formed to cover the opposite electrode 35. Through the aforementioned steps, the light emitting device of the invention is completed.

Embodiment Mode 3

Figure 5A:
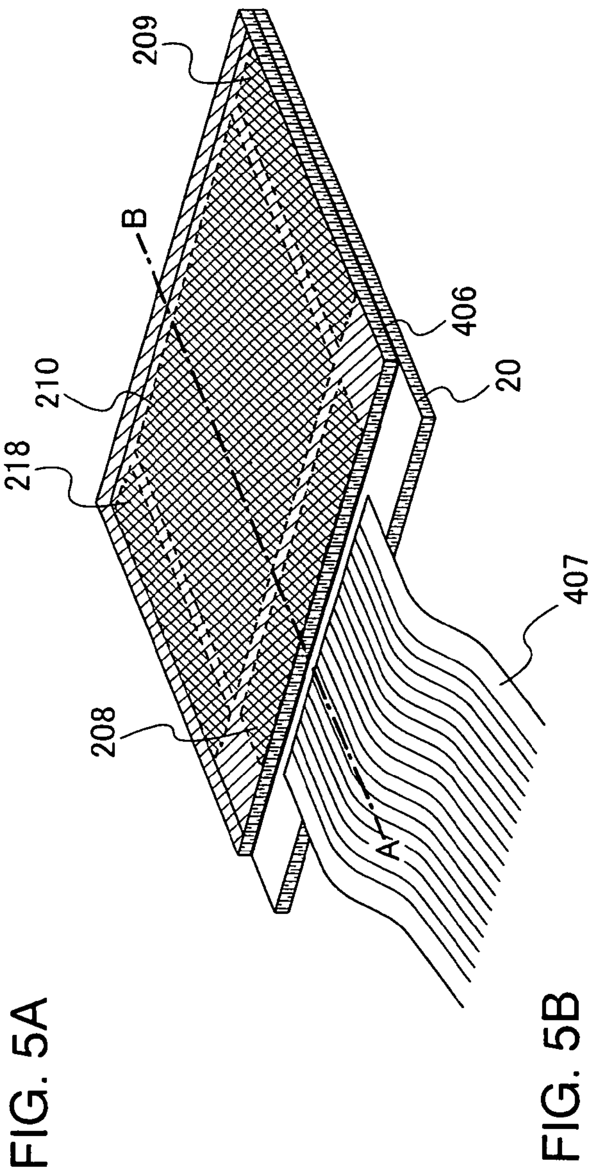
FIGS. 5A and 5B are diagrams each showing a light emitting device of the invention.

Described is a panel which is one mode of the light emitting device of the invention. Over the substrate 20, provided are the pixel portion 210 which has a plurality of pixels including the light emitting element 214, gate drivers 209 and 218, the source driver 208, and a connection film 407 (see FIG. 5A). The connection film 407 is connected to an external circuit (IC chip).

Figure 5B:
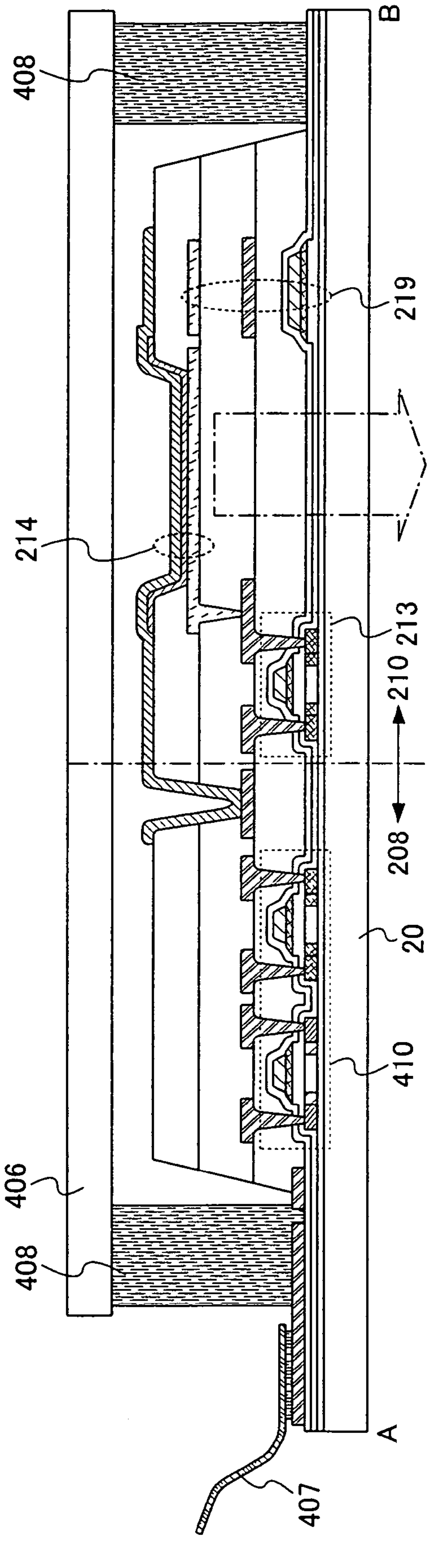

FIG. 5B show a cross-sectional view along A-B of the panel, the driving transistor 213, the light emitting element 214, and the capacitor 219 provided in the pixel portion 210, and a CMOS circuit 410 provided in the source driver 208 are illustrated. A sealing material 408 is provided on the periphery of the pixel portion 210, the gate drivers 209 and 218, and the source driver 208. The light emitting element 214 is sealed by the sealing material 408 and an opposite substrate 406. The sealing treatment is treatment to protect the light emitting element 214 from moisture. Herein, a method to seal by a cover member (glass, ceramics, plastic, metal, and the like) is used, and a method to seal by using a thermosetting resin and an ultraviolet curable resin, or a method to seal by a thin film which has a high barrier effect of metal oxide, nitride and the like may be used. An element formed over the substrate 20 is preferable to be formed by a crystalline semiconductor (polysilicon) which has better characteristics of mobility and the like compared to an amorphous semiconductor. Then, monolithic is realized over the same surface. The panel which has the aforementioned configuration reduces the number of connecting external ICs to realize small size, light weight, and thin type.

Figure 6A:
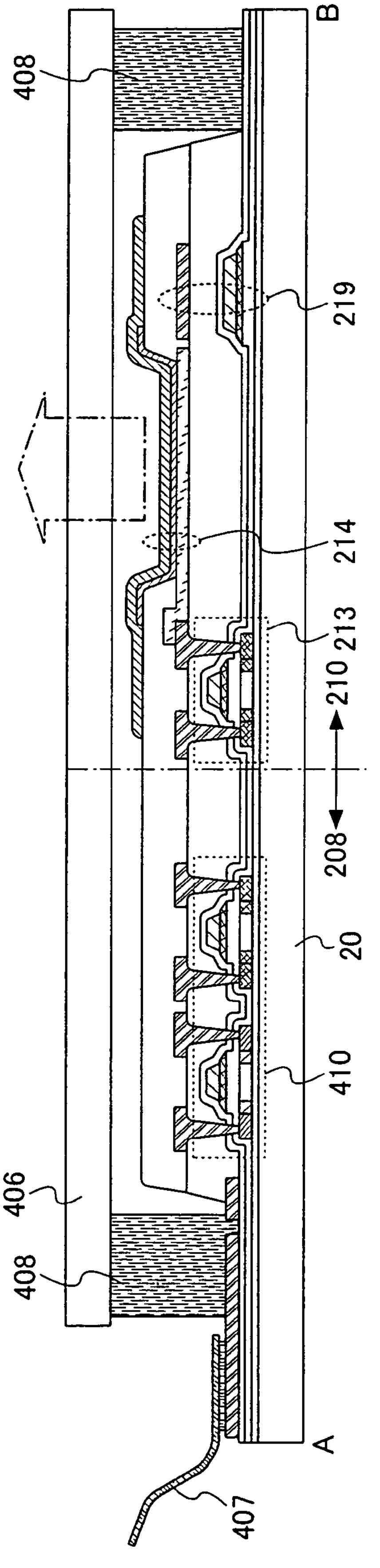
FIGS. 6A and 6B are diagrams each showing a light emitting device of the invention.
Figure 6B:
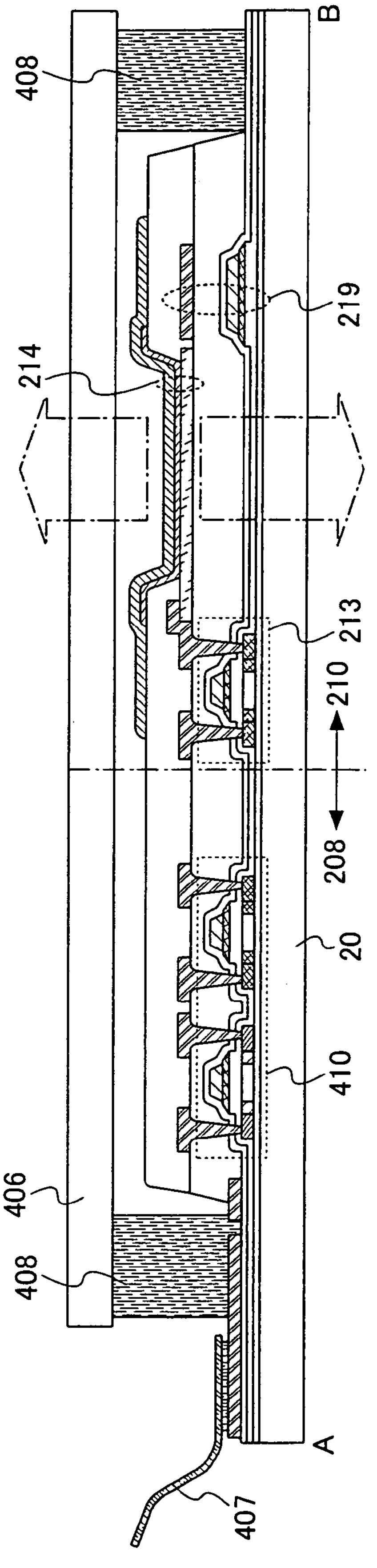
Figure 7:
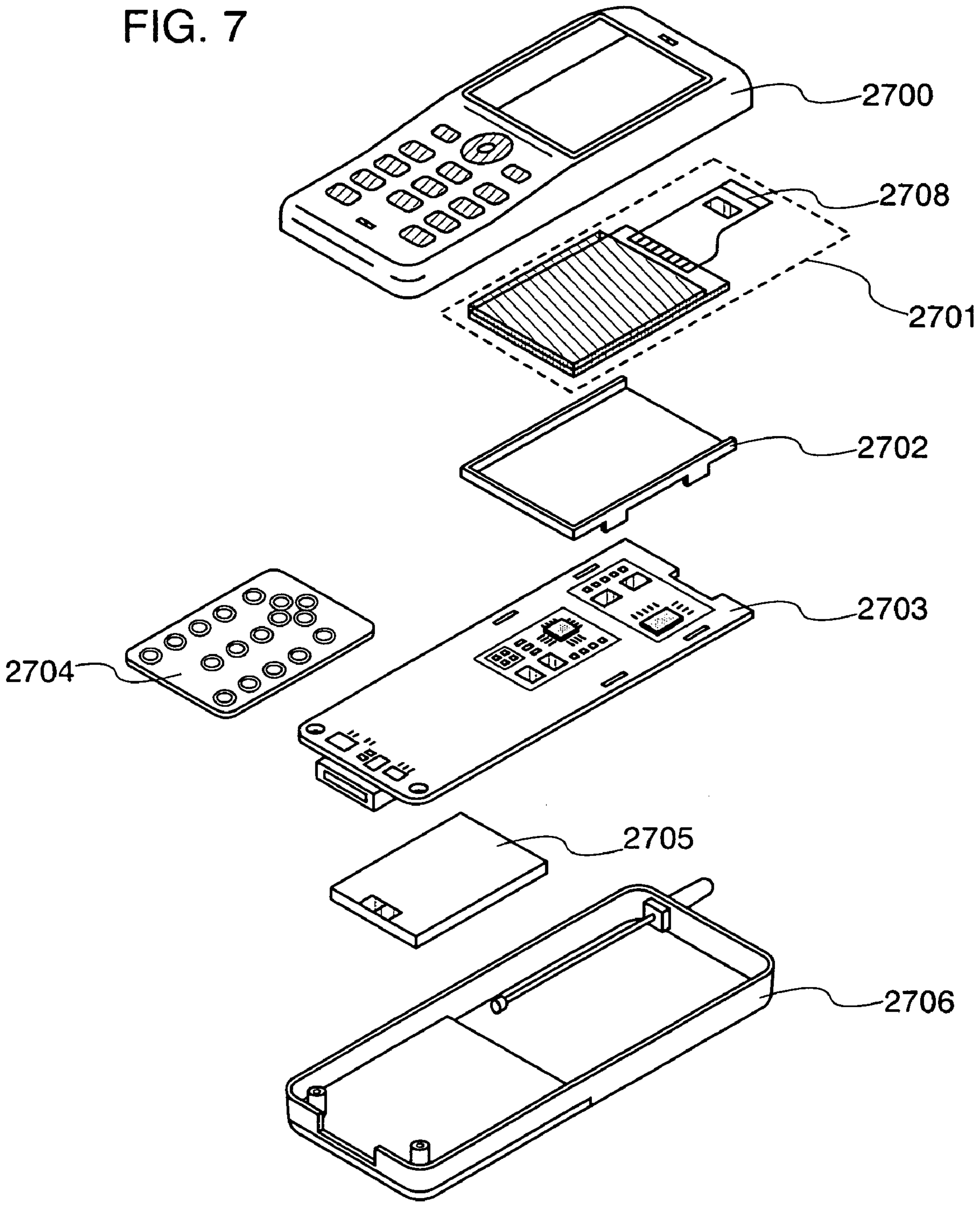
FIG. 7 is a view showing an electronic apparatus of the invention.

Note that in the case where a pixel electrode of the light emitting element 214 has a light-transmitting property and an opposite electrode thereof has a light-shielding property, light is emitted from the light emitting element 214 to a bottom surface (see FIG. 5B). Further, in the case where the pixel electrode of the light emitting element 214 has a light-shielding property and the opposite electrode thereof has a light-transmitting property, light is emitted from the light emitting element 214 to a top surface (see FIG. 6A). Moreover, in the case where both of the pixel electrode of the light emitting element 214 and the opposite electrode thereof have light-transmitting properties, light is emitted from the light emitting element 214 to both sides (see FIG. 6B).

Note that in the configuration shown in FIG. 5B, an insulating layer is provided on the source and drain wirings of the driving transistor 213 to provide the pixel electrode of the light emitting element 214 on the insulating film. However, the invention is not limited to this configuration and the pixel electrode of the light emitting element 214 may be provided in the same layer as the source and drain wirings of the driving transistor 213 (see FIGS. 6A and 6B). Further, in a portion in which the source and drain wirings of the driving transistor 213 and the pixel electrode of the light emitting element 214 are stacked, the source and drain wirings of the driving transistor 213 may be a lower layer while the pixel electrode of the light emitting element 214 may be an upper layer (see FIG. 6A), or the pixel electrode of the light emitting element 214 may be a lower layer while the source and drain wirings of the driving transistor 213 may be an upper layer (see FIG. 6B).

Note that the pixel portion 210 may be constituted by a TFT in which an amorphous semiconductor (amorphous silicon) formed over an insulating surface is used as a channel portion, the gate drivers 209 and 218, and the source driver 208 may be constituted by an IC chip. The IC chip may be attached to the substrate 20, or stuck to the connection film 407 connected to the substrate 20 by a COG (Chip on Glass) method. The amorphous semiconductor may be formed easily over a large-area substrate by using a CVD method, and a step of crystallization is not required, thereby it is possible to provide an inexpensive panel. Further, at this time, when a conductive layer is formed by a droplet-discharging method which is typically an ink-jet method, it is possible to provide a more inexpensive panel.

A light emitting element that the light emitting device of the invention has, includes an element which controls luminance by current or voltage in the category, and specifically includes an OLED (Organic Light Emitting Diode), an MIM type electron source element (electron emission element) used for an FED (Field Emission Display) and the like. The OLED which is one of the light emitting elements has an anode, a cathode, and a layer (hereinafter abbreviated as an electroluminescent layer) including an electroluminescent material in which luminescence (Electro Luminescence) generated by adding an electric field is obtained. The electroluminescent layer is provided between the anode and the cathode, and composed of a mono-layer or a plurality of layers. There is also the case where an inorganic compound is included in the aforementioned layers. The luminescence in the electroluminescent layer includes luminescence (fluorescence) that is generated when an excited singlet state returns to a ground state and luminescence (phosphorescence) that is generated when an excited triplet state returns to a ground state.

Further, although a thin film transistor using a polycrystalline semiconductor, a microcrystal semiconductor (including a semi-amorphous semiconductor), and an amorphous semiconductor may be used for the transistor used in the light emitting device of the invention, the transistor used in the light emitting device of the invention is not limited to the thin film transistor. It may be allowed that a transistor formed by using single-crystalline silicon, a transistor using an SOI (Silicon On Insulator), a transistor using an organic semiconductor, or a transistor using a carbon nanotube is used. Moreover, the transistor provided in the pixel of the light emitting device of the invention may have a single-gate structure, or a multi-gate structure which has a gate electrode with a double-gate configuration or a more gates configuration.

Embodiment Mode 4

One mode of an electronic apparatus using the light emitting element of the invention is described with reference to FIGS. 7 and 8A to 8F. An example of an electronic apparatus illustrated here is a mobile phone set including housings 2700 and 2706, a panel 2701, a housing 2702, a printed wiring board 2703, an operation button 2704, and a battery 2705 (see FIG. 7). The panel 2701 has a pixel portion in which a plurality of pixels are arranged in matrix and a state that the pixel portion is sealed by a pair of substrates. The panel 2701 is incorporated in the housing 2702 by free desorption and the housing 2702 is fit to the printed wiring board 2703. A size and a dimension of the housing 2702 are changed appropriately in accordance with an electronic apparatus in which the panel 2701 is incorporated. The printed wiring board 2703 mounts a plurality of IC chips correspond to one or a plurality of elements selected from a central processing unit (CPU), a controller circuit, a power supply circuit, a buffer amplifier, a source driver, and a gate driver. A module corresponds to a state that the printed wiring board 2703 is mounted on the panel 2701.

The panel 2701 is connected to the printed wiring board 2703 through a connection film 2708. The panel 2701, the housing 2702 and the printed wiring board 2703 are put inside the housings 2700 and 2706 along with the operation button 2704 and the battery 2705. The pixel portion that the panel 2701 has is arranged to be visible from an opening window provided in the housing 2700.

Note that the housings 2700 and 2706 show one example of an appearance shape of mobile phone sets, and an electronic apparatus in this embodiment mode may be changed in various modes in accordance with function and use of the electronic apparatus. Therefore, one example mode of the electronic apparatus is described hereinafter with reference to FIGS. 8A to 8F.

Figure 8A:
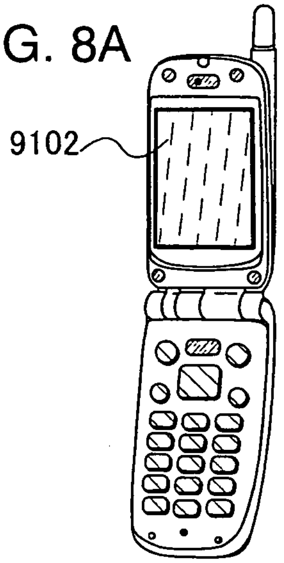
FIGS. 8A to 8F are views each showing an electronic apparatus of the invention.
Figure 8B:
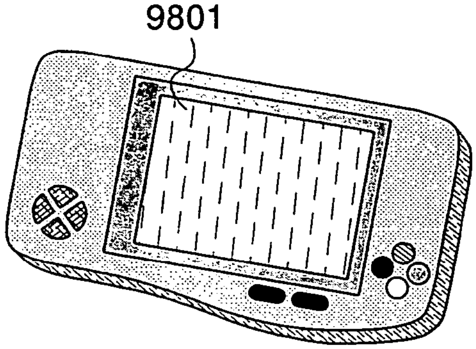
Figure 8C:
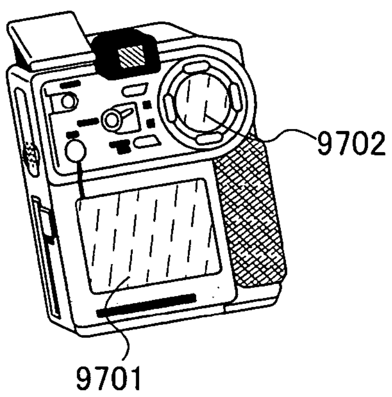
Figure 8D:
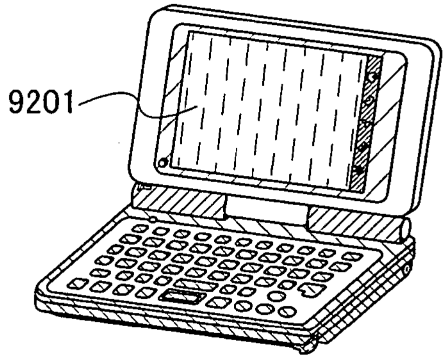
Figure 8E:
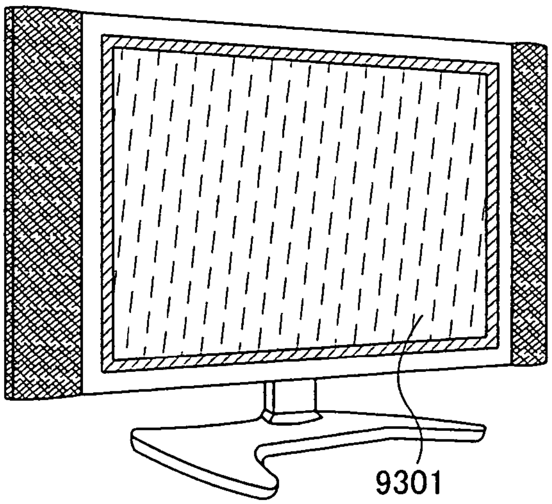
Figure 8F:
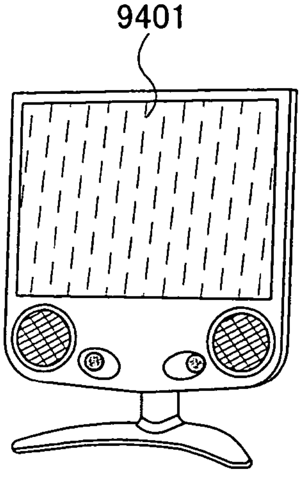

A mobile phone set which is a portable terminal includes a pixel portion 9102 and the like (see FIG. 8A). A portable game machine which is a portable terminal includes a pixel portion 9801 and the like (see FIG. 8B). A digital video camera includes pixel portions 9701 and 9702, and the like (see FIG. 8C). A PDA (Personal Digital Assistant) which is a portable information terminal includes a pixel portion 9201 and the like (see FIG. 8D). A television apparatus includes a pixel portion 9301 and the like (see FIG. 8E). A monitoring device includes a pixel portion 9401 and the like (see FIG. 8F).

The invention may be applied to various electronic apparatuses such as a mobile phone set (also called a mobile phone device or a mobile phone), a PDA, an electronic organizer, and a portable game machine which are portable terminals, a television apparatus (also called a TV or a television receiver), a display (also called a monitoring device), a camera such as a digital camera and a digital video camera, a sound reproducing device such as a car audio, and a home game machine. This embodiment mode may be freely combined with the aforementioned embodiment modes.

This application is based on Japanese Patent Application serial no. 2004-353356 filed in Japan Patent Office on 6th, Dec. 2004, the entire contents of which are hereby incorporated by reference.

What is claimed is:

1. A light emitting device comprising:
a first pixel, a monitoring line, and a second pixel,
said first pixel comprising:
a first light emitting element,
a constant current source,
a switch, and
a circuit; and
said second pixel comprising:
a second light emitting element,
wherein one electrode of the first light emitting element is connected to the monitoring line through the switch;
wherein the circuit controls on and off of the switch in accordance with a potential of one electrode of the first light emitting element; and
wherein the constant current source supplies current to the first light emitting element.

2. The light emitting device according to claim 1, wherein the first light emitting element and the second light emitting element are formed over the same insulating surface.

3. The light emitting device according to claim 1, wherein the light emitting device is applied to a panel.

4. The light emitting device according to claim 1, wherein the light emitting device is applied to a module.

5. The light emitting device according to claim 1, wherein the light emitting device is applied to a portable terminal.

6. The light emitting device according to claim 1, wherein the light emitting device is applied to a camera.

7. The light emitting device according to claim 1, wherein the light emitting device is applied to a display.

8. The light emitting device according to claim 1, wherein the light emitting device is applied to a television apparatus.

9. A light emitting device comprising:
a first pixel portion, a second pixel portion, and an amplifier,
said first pixel portion including:
a first pixel, and
a monitoring line,
said first pixel comprising:
a first light emitting element,
a constant current source,
a switch, and
a circuit; and
said second pixel portion including:
a power supply line, and
a second pixel,
said second pixel comprising:
a second light emitting element, and
a transistor;
wherein one electrode of the first light emitting element is connected to the monitoring line through the switch;
wherein the circuit controls on and off of the switch in accordance with a potential of one electrode of the first light emitting element;
wherein one electrode of the second light emitting element is connected to the power supply line through the transistor;
wherein the monitoring line is connected to the power supply line through the amplifier; and
wherein the constant current source supplies current to the first light emitting element.

10. The light emitting device according to claim 9, wherein the transistor operates in a linear region.

11. The light emitting device according to claim 9, wherein the first light emitting element and the second light emitting element are formed over the same insulating surface.

12. The light emitting device according to claim 9, wherein the light emitting device is applied to a panel.

13. The light emitting device according to claim 9, wherein the light emitting device is applied to a module.

14. The light emitting device according to claim 9, wherein the light emitting device is applied to a portable terminal.

15. The light emitting device according to claim 9, wherein the light emitting device is applied to a camera.

16. The light emitting device according to claim 9, wherein the light emitting device is applied to a display.

17. The light emitting device according to claim 9, wherein the light emitting device is applied to a television apparatus.

18. The light emitting device according to claim 9, wherein the amplifier comprises an operational amplifier, a sense amplifier, or a differential amplifier.

19. A light emitting device comprising:
a first pixel portion, a second pixel portion, and an amplifier,
said first pixel portion including:
a first pixel, and
a monitoring line,
said first pixel comprising:
a first light emitting element,
a constant current source,
a first transistor, and
an inverter;
said second pixel portion including:
a power supply line, and
a second pixel,
said second pixel comprising:
a second light emitting element, and
a second transistor;
wherein one electrode of the first light emitting element is connected to the monitoring line through the first transistor;
wherein the constant current source supplies current to the first light emitting element;
wherein an input terminal of the inverter is connected to one electrode of the first light emitting element;
wherein an output terminal of the inverter is connected to a gate electrode of the first transistor;
wherein the inverter outputs a potential which controls on and off of the first transistor to the gate electrode of the first transistor in accordance with a potential of one electrode of the first light emitting element;
wherein one electrode of the second light emitting element is connected to the power supply line through the second transistor; and wherein the monitoring line is connected to the power supply line through the amplifier.

20. The light emitting device according to claim 19, wherein the second transistor operates in a linear region.

21. The light emitting device according to claim 19, wherein the first light emitting element and the second light emitting element are formed over the same insulating surface.

22. The light emitting device according to claim 19, wherein the light emitting device is applied to a panel.

23. The light emitting device according to claim 19, wherein the light emitting device is applied to a module.

24. The light emitting device according to claim 19, wherein the light emitting device is applied to a portable terminal.

25. The light emitting device according to claim 19, wherein the light emitting device is applied to a camera.

26. The light emitting device according to claim 19, wherein the light emitting device is applied to a display.

27. The light emitting device according to claim 19, wherein the light emitting device is applied to a television apparatus.

28. The light emitting device according to claim 19, wherein the amplifier comprises an operational amplifier, a sense amplifier, or a differential amplifier.

29. A light emitting device comprising:

a monitoring pixel comprising a first light emitting element, a constant current source, a switch, and a circuit;

a pixel comprising a second light emitting element;

a monitoring line; and an amplifier, wherein one electrode of the first light emitting element is connected to the amplifier through the switch and the monitoring line, wherein one electrode of the second light emitting element is connected to the amplifier through the monitoring line, wherein the circuit controls on and off of the switch in accordance with a potential of one electrode of the first light emitting element, and wherein the constant current source supplies current to the first light emitting element.

30. The light emitting device according to claim 29, wherein the first light emitting element and the second light emitting element are formed over the same insulating surface.

31. The light emitting device according to claim 29, wherein the light emitting device is applied to a panel.

32. The light emitting device according to claim 29, wherein the light emitting device is applied to a module.

33. The light emitting device according to claim 29, wherein the light emitting device is applied to a portable terminal.

34. The light emitting device according to claim 29, wherein the light emitting device is applied to a camera.

35. The light emitting device according to claim 29, wherein the light emitting device is applied to a display.

36. The light emitting device according to claim 29, wherein the light emitting device is applied to a television apparatus.

* * * * *